(12) United States Patent
Moretti Polegato et al.

(10) Patent No.: US 12,010,769 B2
(45) Date of Patent: Jun. 11, 2024

(54) CONTROL CIRCUIT FOR A LUMINOUS GARMENT AND METHOD FOR ACTIVATING LIGHT SOURCES ON GARMENTS

(71) Applicant: GEOX S.p.A., Montebelluna (IT)

(72) Inventors: Mario Moretti Polegato, Montebelluna (IT); Giuliano Gallo, Montebelluna (IT)

(73) Assignee: GEOX S.p.A., Montebelluna (IT)

( * ) Notice: Subject to any disclaimer, the term of this patent is extended or adjusted under 35 U.S.C. 154(b) by 217 days.

(21) Appl. No.: 17/611,339

(22) PCT Filed: May 13, 2020

(86) PCT No.: PCT/IB2020/054500
§ 371 (c)(1),
(2) Date: Nov. 15, 2021

(87) PCT Pub. No.: WO2020/230033
PCT Pub. Date: Nov. 19, 2020

(65) Prior Publication Data
US 2022/0232675 A1     Jul. 21, 2022

(30) Foreign Application Priority Data
May 15, 2019   (IT) .................. 102019000006846

(51) Int. Cl.
*H05B 47/10*     (2020.01)
*A41D 27/08*     (2006.01)
(Continued)

(52) U.S. Cl.
CPC .......... *H05B 45/10* (2020.01); *A41D 27/085* (2013.01); *H05B 47/115* (2020.01); *H05B 47/155* (2020.01)

(58) Field of Classification Search
CPC ...... H05B 45/10; H05B 47/10; H05B 47/105; H05B 47/115; H05B 47/155; H05B 39/02;
(Continued)

(56) References Cited

U.S. PATENT DOCUMENTS 5,457,900 A    10/1995 Roy
11,408,852 B2 *  8/2022 Chen .................. G01N 1/22
(Continued)

FOREIGN PATENT DOCUMENTS

EP          1 100 100 A1    5/2001

OTHER PUBLICATIONS

International Search Report and Written Opinion dated Jul. 14, 2020 in PCT/IB2020/054500 filed May 13, 2020.
(Continued)

*Primary Examiner* — Long Nguyen
(74) *Attorney, Agent, or Firm* — Oblon, McClelland, Maier & Neustadt, L.L.P.

(57) ABSTRACT

The invention relates to a circuit for controlling light sources for a luminous garment, such as footwear, jackets, trousers, caps, belts. The circuit comprises an electric power source, such as a battery, a processor, one or more light sources and a switch. The processor and the light sources are powered by the electric power source. The light sources are connected to the processor, which controls their turning on and turning off, for example selectively based on a light program. The switch is connected to both the electric power source and the processor, and can be operated by the user in order to switch the processor on and off. The circuit is advantageously configured so that the electric resistance inside the processor, between the contact with the switch and the contact with the positive pole of the electric power source, is higher than the circuit resistance upstream of the processor itself, i.e. the
(Continued)

resistance between the electric power source and the contact of the processor with the switch. In the event that water or condensation cause the circuit to close, even though the switch is in the open position, the current powering the processor is still insufficient to cause it to be switched on. A method for activating light sources in a luminous garment is also described.

17 Claims, 5 Drawing Sheets

(51) Int. Cl.
*H05B 45/10* (2020.01)
*H05B 47/115* (2020.01)
*H05B 47/155* (2020.01)

(58) Field of Classification Search
CPC ...... H05B 41/14; H05B 41/18; A41D 27/085; A43B 3/36
See application file for complete search history.

(56) References Cited

U.S. PATENT DOCUMENTS

| 11,754,271 | B2* | 9/2023 | Lin | F21V 23/0492 |
| | | | | 362/103 |
| 2004/0160196 | A1 | 8/2004 | Wong | |
| 2020/0116341 | A1* | 4/2020 | Lin | F21V 23/0485 |

OTHER PUBLICATIONS

European Office Action issued in European Patent Application No. 20730727.3 on Jan. 3, 2024, citing reference 1 therein.

* cited by examiner

CONTROL CIRCUIT FOR A LUMINOUS GARMENT AND METHOD FOR ACTIVATING LIGHT SOURCES ON GARMENTS

FIELD OF THE INVENTION

In its more general aspect this invention refers to the technical field of luminous garments and in particular to a control circuit for a luminous garment and a method for activating light sources provided on garments.

STATE OF THE ART

In the clothing sector, it is known to make luminous garments, so called because they are equipped with light screens, usually of LED-type. For example, it is known to make footwear, jackets and caps equipped with light screens, whose function is to increase the visibility of the wearer, or for recreational purposes.

Among luminous footwear there are those comprising light screens that use so-called flexible printed circuits, also known by the acronym FPC (Flexible Printed Circuit). Usually, these light screens comprise a transparent casing, an FPC comprising a plurality of conductive lines that is housed in the transparent casing, a plurality of luminous elements, for example LED (Light-Emitting Diode), placed on the FPC and electrically connected thereto, a control chip still electrically connected to the FPC and placed thereon, a support also housed in the transparent casing and adapted to support and maintain in position the FPC inside the transparent casing, and electrical connection cables to connect the FPC to a battery.

FPC flexible printed circuit are also used to make screens for jackets, caps and can be used to make trousers and other luminous garments.

FIG. 3 shows a traditional control circuit of a light screen. Reference B denotes the voltage source, in practice a battery, e.g. a 3 V non-rechargeable one or a 3.7 V rechargeable one. Battery B is electrically connected to a processor C (microprocessor) through two terminals 4 and 11. One or more light sources L, e.g. LEDs, are electrically connected to the processor C through the terminal 14, and to the battery B. An ON/OFF type switch P is electrically connected to the processor C through the terminal 7, and to the battery.

Often, when the circuit is used on footwear, there is a motion sensor S electrically connected to the processor C through the terminal 10 and to the battery. A typical motion sensor S comprises a metal stem inserted into a metal spring: the stresses given to the footwear cause the spring to flex and when the spring touches the metal stem, the motion sensor sends to the processor C a switching on signal. The processor C controls the selective turning on and turning off of each light source L according to the set light programs.

U.S. Pat. No. 5,457,900 and EP-A-1100100 describe solutions known in the art. In particular, U.S. Pat. No. 5,457,900 describes footwear comprising luminous LEDs controlled by a circuit. The circuit comprises a battery, a microprocessor and a switch, and is configured so as to stroboscopically turn the LEDs on and off and show graphic effects, in response to the stresses the footwear undergoes during walking.

The Applicant has found that traditional control circuits, such as the one just described, are affected by the following drawback: possible seepages of water or the presence of condensation, particularly inside the switch P or near terminals, connectors or lugs that are in different sections of the circuit, may cause the light sources to be turned on accidentally, because water or condensation may electrically close the circuit even when the switch P is in the open position. Seepages or condensation may be caused by accidental immersion of the garment in water, or by the moisture in the atmosphere, or by washes, for example in a washing machine.

Accidental activation of the light sources L, caused by water or condensation, is not only undesirable, but also wastes energy and can lead to rapid and uncontrolled consumption of the battery B and oxidation of circuit parts.

In addition, accidental switching on of the circuit may cause anomalous operation of the processor C.

For example, water may prevent the processor P from being turned off, because even though the user operates the switch P, he's not able to open the circuit and prevent the processor C from being powered. In other words, the processor C may remain switched on all the time.

In addition, if the processor C is programmed to run a light program from the beginning, whenever the motion sensor S emits a signal, malfunctioning of the switch P due to water or condensation may cause the light sources to be continuously turned on when the garment is subject to vibrations and the stem inside the motion sensor spring is continuously touched by the latter, for example while the wearer is walking or running.

SUMMARY OF THE INVENTION

The technical problem underlying the present invention is to provide a control circuit for a luminous garment, for example a jacket, a cap or footwear, and a corresponding method for activating light sources, thereby allowing the limits of traditional systems to be overcome in a simple, effective and cost effective way, i.e. allowing the problems caused by water seepages or presence of condensation to be overcome.

Therefore, the first aspect of the present invention relates to a circuit, according to claim 1, for controlling light sources for a luminous garment, such as footwear, jackets, trousers, caps, belts.

In particular, the circuit comprises an electric power source, such as a battery, a processor, e.g. a microprocessor, one or more light sources, e.g. LEDs, and a switch. The processor and the light sources are powered by the electric power source. The light sources are connected to the processor, which controls their turning on and turning off, for example selectively based on a light program. The switch is connected to both the electric power source and the processor, and can be operated by the user in order to switch the processor on and off.

More specifically, the positive pole of the electric power source is connected to a first contact of the processor, and the switch is connected to a second contact of the processor.

The circuit is advantageously configured so that the electric resistance of the processor, between the second contact with the switch and the first contact with the positive pole of the electric power source, i.e. the resistance inside the processor that is measured between these two contacts, is higher than the resistance of the circuit upstream of the processor itself (upstream from a logic point of view), i.e. the resistance between the electric power source and the second contact of the processor with the switch.

Thanks to this design, this technical result can be achieved: if water or condensation causes the circuit to close, even though the switch is in the open position, the current powering the processor will be insufficient in any case to cause the latter to be switched on, and a current flow will flow in the part of the circuit upstream of the processor, precisely because the resistance will be lower than that of the processor.

The short circuit caused by water or condensation wetting the switch does not cause the processor to be undesirably switched on, and therefore does not cause the light sources to be accidentally turned on.

By taking care of configuring the circuit upstream of the processor in such a way that the corresponding resistance is lower on the whole than the resistance inside the processor measurable between the aforesaid first and second contacts (positive pole of the power supply, switch), any current flow generated by the short circuit will be dissipated to a large extent in the circuit upstream of the processor, so that the processor will not be powered enough to be switched on.

As will be described below, this technical effect can be achieved by specific configurations of the control circuit.

Preferably, the resistance inside the processor, measured between the contact with the switch and the contact with the positive pole of the electric power source, is equal to 150 kΩ, or higher than this value. This is a minimum value which, on the basis of tests carried out, has proved to be suitable for applications on footwear, i.e. in circuits which can be used to make shoes equipped with light screens, e.g. programmable LED screens.

In a first embodiment, the circuit comprises at least one resistor functionally interposed between the power line connecting the positive pole of the electric power source and the power line connecting the switch to the processor. The at least one resistor is electrically connected between the first contact and second contact of the processor.

In this embodiment, the resistance of the circuit upstream of the processor, i.e. the resistance between the electric power source and the second contact of the processor with the switch, is defined by the value of the resistor R or resistors R, if more than one (connected in series and/or series/parallel).

In the first embodiment the switch is of the ON/OFF type, for example is a two-position button.

Thanks to this configuration, the accidental closing of the circuit caused by water would cause a higher current flow through the resistor with respect to the current absorbed by the processor, so that the latter would remain switched off and the light sources would remain turned off.

In principle, the resistance of the resistor R has to be selected within a range:
  has to be low enough to achieve the technical effect of dissipating energy (by Joule effect) and to prevent the processor from being switched on in the event of a closure of the circuit caused by water, and at the same time
  has to be high enough to prevent current flow in excess through the switch, which could otherwise burn out, and to prevent the electric cables of the circuit from being overheated and/or prematurely oxidized or to prevent damages to the battery.

During the design step, the expert in the field can carry out tests for each selected processor, simply by wetting the switch and inserting resistors having different resistance into the circuit, until the lower and upper limits of the range are identified.

For example, in footwear applications the resistance of the resistor is preferably in the range 0.1 kΩ-100 kΩ, and more preferably is 10 kΩ. Clearly, several resistors connected in series, or in parallel or in series/parallel can be used as an alternative to a single resistor.

In case of normal operation of the circuit, in the absence of water, i.e. with dry circuit, clearly the current flowing through the resistor, or the resistors if more than one, is inversely proportional to the (total) resistance value of the resistor(s), according to Ohm's law.

In a second embodiment the switch is also of ON/OFF type and the circuit comprises at least one resistor, but the at least one resistor is provided along the power line connecting the switch to the processor, upstream of the switch with respect to the processor.

Preferably, in the second embodiment, the resistance of the resistor, or the total resistance of the resistors, is less than 150 kΩ, and is preferably equal to 100 kΩ. The common processors used in the light circuits of garments, and in particular of footwear, would not be able to be switched on with resistance values greater than 150 kΩ.

For example, considering a common processor used in footwear circuits, in case the water resistance is 80 kΩ, the resistor can have a maximum resistance of 100 kΩ, in order to achieve the technical effect and at the same time allow the normal operation of the dry circuit, i.e. to allow the processor to be switched on when the switch is closed.

For example, a typical processor used to control the turning on of LEDs in footwear operates with an operating voltage in the range of 2-5.5 V and absorbs an operating current of 0.1 mA with no load, i.e. with the LEDs off; the current absorption with the processor in stand-by mode is 2 μA. The current absorption during the operation with the load, i.e. with the LEDs powered, is 11 mA.

The Applicant reserves the right to file a divisional patent application for the second embodiment.

In a third embodiment, the switch is a shunting switch with a normally closed contact NC, which connects the positive pole of the electric power source to the processor C, and a normally open contact NO, which connects the negative pole of the electric power source to the processor. The normally closed contact NC and the normally open contact NO are connected to each other at a point between the shunting switch and the processor. If the contact NO were accidentally closed by water, the water resistance would still be higher than the resistance of the contact NC and therefore no current would flow through the contact NO closed by water, with the result that the processor would not be switched on.

Compared to the first and second embodiments, there is no energy dissipation in a resistor in the third embodiment.

The Applicant reserves the right to file a divisional patent application for the third embodiment.

A fourth embodiment is similar to the third one, but in addition provides at least one resistor functionally arranged between the positive pole of the electric power source and the normally closed contact of the shunting switch.

The Applicant reserves the right to file a divisional patent application for the fourth embodiment.

A fifth and a sixth embodiments are similar to the third one, but provide, in addition, at least one resistor functionally arranged between the normally closed contact NC of the shunting switch P' and the processor C. In particular, in the fifth embodiment, the at least one resistor is functionally arranged between the normally closed contact NC of the shunting switch and the processor C, upstream of the connection between the normally closed contact NC and the normally open contact NO.

The Applicant reserves the right to file a divisional patent application for the fifth embodiment.

In the sixth embodiment the at least one resistor is functionally arranged between the normally closed contact NC of the shunting switch and the processor C, downstream of the connection between the normally closed contact NC and the normally open contact NO.

The Applicant reserves the right to file a divisional patent application for the sixth embodiment.

For example, in these embodiments equipped with shunting switch, the resistance of the resistor, or the connected resistors, is preferably less than 150 kΩ.

Preferably the wire connections of the circuit, which define the afore mentioned power lines, are made with tinned copper wires, in order to eliminate or minimize the problem of oxidation that would otherwise be accentuated by the possible presence of water in the garment.

A second aspect of the invention relates to a method, according to claim 13, for activating light sources of a luminous garment, such a jacket, footwear, a cap. The method comprises:
a) making a control circuit comprising a processor, one or more light sources and a switch,
b) powering the processor and the light sources by an electric power source,
c) connecting the light sources to the processor and subordinating the turning on and the turning off of the light sources to the processor,
d) connecting the switch to the electric power source and the processor, so that the switching on and the switching off of the processor are controlled by the switch.

Advantageously the method also provides for:
e) configuring the circuit so that the (internal) resistance of the processor between a second contact with the switch and a first contact with the positive pole of the electric power source is higher than the resistance of the circuit between the electric power source and the contact of the processor with the switch.

According to what has been explained above in relation to the circuit, the concept behind the above mentioned method is to make the circuit water-resistant by ensuring that any closure of the circuit caused by water leads to energy dissipation through the branches of the circuit upstream (from a logical point of view) of the processor so that the processor receive not enough energy to be switched on. The advantage is to prevent any water or condensation that may be present in the garment from causing the light sources to be undesirably turned on and the impossibility to turn them off.

Step e) is preferably carried out according to one of the following ways:
e') installing an ON/OFF switch and inserting at least one resistor upstream of the switch with respect to the processor, or downstream of the switch between the line connecting the positive pole of the electric power source to the processor and the line connecting the switch to the processor, or
e") installing a shunting switch with a normally closed contact NC, which connects the positive pole of the electric power source to the processor, and a normally open contact NO, which connects the negative pole of the electric power source to the processor, and wherein the normally closed contact NC and the normally open contact NO are connected to each other at an intermediate point between the shunting switch and the processor.

The operation and advantages of these configurations are the same described in relation to the circuit according to the present invention.

In turn, step e") is preferably carried out by providing, in addition, at least one resistor:

between the positive pole of the electric power source and the normally closed contact NC of the shunting switch, or between the normally closed contact NC of the shunting switch and the processor, either upstream or downstream of the connection between the normally closed contact NC and the normally open contact NO.

The operation and advantages of these configurations are the same described in relation to the circuit according to the present invention.

BRIEF DESCRIPTION OF THE FIGURES

Further characteristics and advantages of the invention will be better highlighted by considering the following detailed description of some preferred, but not exclusive, embodiments illustrated by way of example only and without limitations, with the aid of the accompanying drawings, in which.

DETAILED DESCRIPTION OF THE INVENTION

Figure 1:
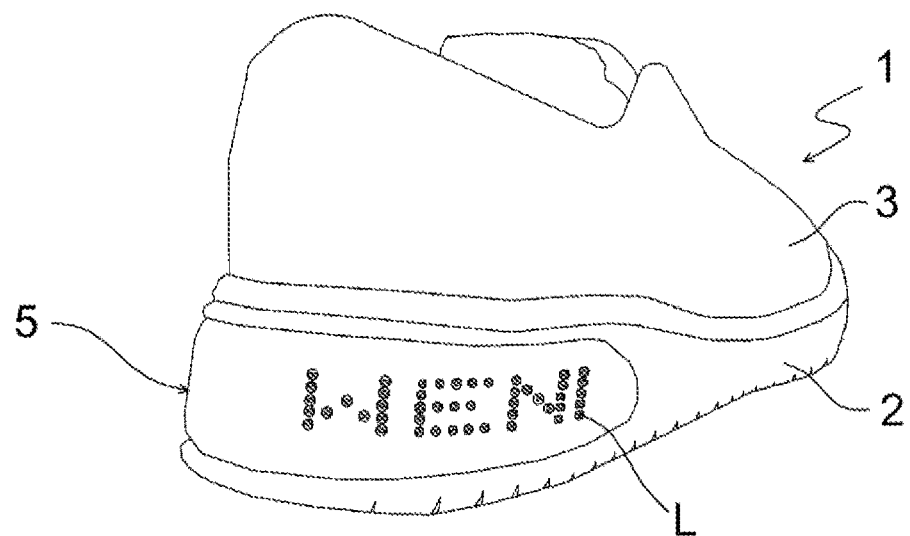
FIG. 1 is a perspective rear view of luminous footwear, according to the present invention.

Referring to FIG. 1, the footwear 1 according to the present invention, provided with a sole 2 and an upper combined with the sole 2, is shown. At the rear region of the sole 2, there is a luminous screen 5 comprising a plurality of light sources L, preferably LEDs. The screen 5 is operated by a control circuit according to the present invention, not shown in FIG. 1, housed in shoe 1, electrically connected to the luminous screen 5, for example by means of a connector. The light sources L are selectively turned on and off by the control circuit according to one or more light programs, to form texts, logos, drawings, etc. A switch P, not shown, is placed frontally on the shoe, at the tongue.

Figure 2:
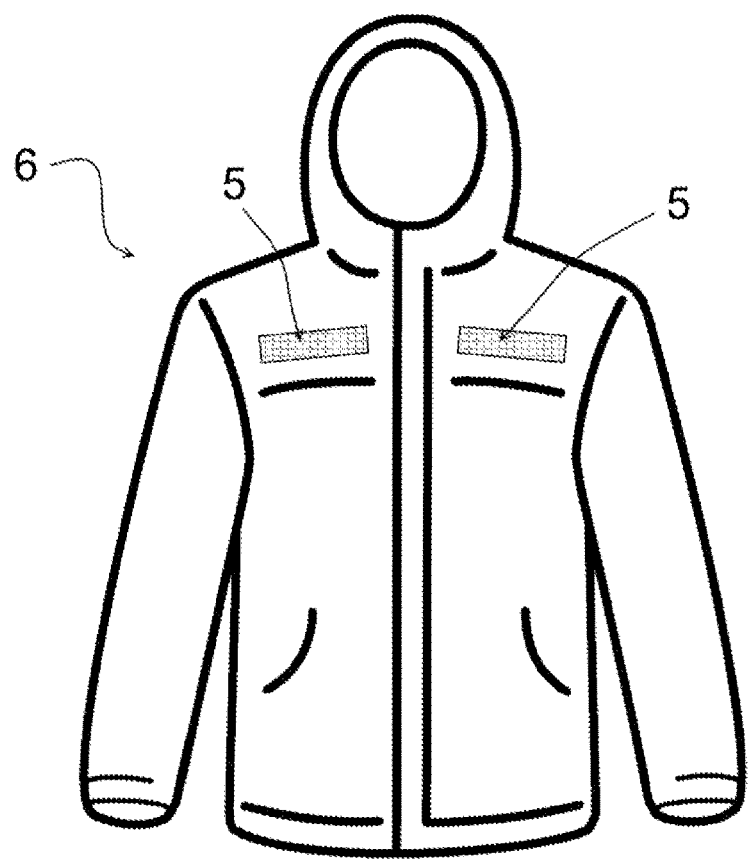
FIG. 2 is a front view of a luminous jacket, according to the present invention.

FIG. 2 frontally shows a jacket 6 according to the present invention, comprising two light screens 5, similar to the above-described light screen. The two light screens are operated by the same control circuit according to the present invention, or each screen 5 is operated by a dedicated control circuit.

Figure 3:
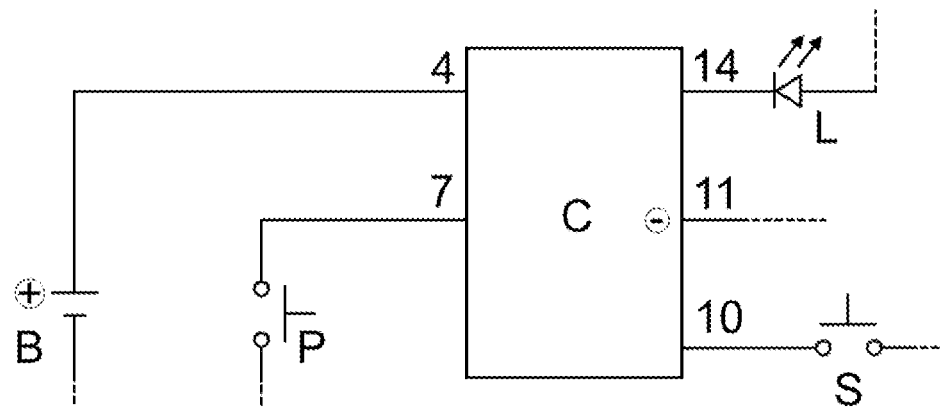
FIG. 3 is a schematic view of a control circuit for luminous garments, according to the known art.

FIG. 3 shows a control circuit according to known art, whose description has been given in the initial paragraphs.

A battery B provides the voltage needed to power a processor C, the light sources L and the motion sensor S. An ON/OFF switch P, which can be manually activated by the user, controls the turning on and off of the circuit. When the garment is wet, or has absorbed moisture which in turn has generated condensation, even if the switch P is in the open (OFF) position, it may be electrically closed by water. In other words, the water can cause the circuit to be undesirably switched on without control, making it impossible to deactivate the light sources L and, therefore, causing abnormal consumption of the battery B. If the motion sensor S were continuously stressed, in fact, as it would happen when the wearer runs, it would cause the light sources L to be continuously turned on by the processor C and, due to the short circuit caused by the water, the user wouldn't be able to turn off the light sources L even physically acting on the switch P.

In the enclosed figures, same reference numbers denote same or equivalent components.

Figure 4:
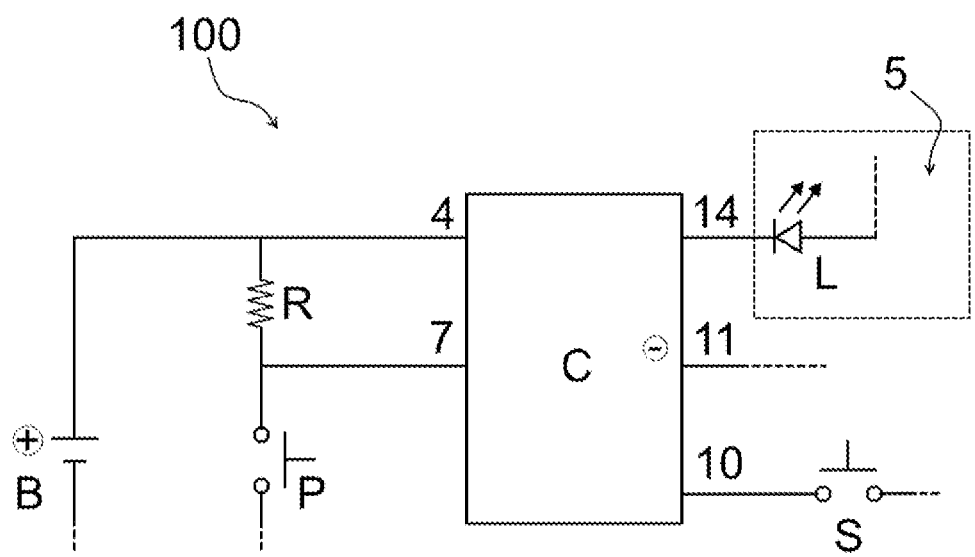
FIG. 4 is a schematic view of a first embodiment of a control circuit for luminous garments, according to the present invention.

FIG. 4 shows a control circuit 100 according to a first embodiment of the present invention. The control circuit 100 comprises a voltage source, for example a traditional 3 Volt battery B or a rechargeable 3.7 Volt battery B, a processor C, e.g. a microprocessor or a programmable integrated circuit on which firmware is installed, one or more light sources L, preferably LEDs mounted on a LED stripe, to form a screen 5 that can be mounted on the garment, at sight, a user-operated ON/OFF switch P, and a motion sensor S, e.g. of the type described above.

Preferably, the processor C selectively controls the turning on and turning off of the light sources L, based on one or more light programs stored in a memory of the processor C and run by the firmware.

The light sources can be connected in series, parallel or series/parallel.

The switch P can be, for example, an ON/OFF push button.

The battery B is connected to the processor C at terminals 4 and 11. The light sources L, i.e. the screen 5, and the motion sensor S are also powered by the battery B; in particular The light sources L, i.e. the screen 5, are connected to processor C at the terminal 14.

If there is the motion sensor S, it is connected to the processor C at the terminal 10.

The switch P is connected to the processor C at the terminal 7.

Clearly, the processor C can have more terminals with respect to those drawn and described, for example it can be equipped with terminals for the logical connection to an external unit for firmware programming, such as a personal computer or a working station, or for the connection to I/O connection interfaces, e.g. wireless.

The term terminal must be understood in a broad sense of electric contact: in fact, it is not required to be a real terminal or a lug, but it could also be welded points where the copper wires are welded to the printed circuit of the processor C.

In this sense, the terminal 4 corresponds to the first contact described above and the terminal 7 corresponds to the second contact described above.

The motion sensor S is optional in all the embodiments described herein.

The motion sensor S, if any, sends a switching-on signal to the processor C when the switch P is ON, i.e. the circuit is switched on, and when the motion sensor S detects motion, e.g. the bump of the sole 2 of the footwear 1 against the ground, or when it detects stresses caused by the wearer of the jacket 6.

Advantageously, the circuit 100 comprises at least one resistor R, or several resistors R in series and/or series/parallel, electrically inserted between the terminals 4 and 7, i.e. between the power line of the positive pole of the voltage source B and the power line of the switch P connected to the respective terminals 4 and 7 of the processor C. The nominal value of the resistance of the resistor R or resistors R, expressed in ohms, is lower than the resistance inside the processor C measurable between the terminals 4 and 7 (when the processor C is separated from the battery B and the switch P), i.e. it is lower than the total resistance of the components of the circuit 100 that are downstream of the resistor R or resistors R. This configuration allows the achievement of this advantage: due to the undesired closing of the circuit caused by the water/moisture in the garment 1, 6, when the switch P is in the OFF position, the current flow, expressed in Amperes, is higher through the resistor R, or the series resistors R, with respect to the current reaching the processor C, which is not enough to switch the processor C on. In other words, the functional arrangement of at least one resistor R between the battery B and the switch P prevents water from undesirably switching the processor C on, so that the latter remains switched off until the switch P is actually led to the closed position ON of the circuit 100. This way, the light screen 5 also remains turned off, i.e. the light sources L remain turned off until the switch P is set to ON.

The skilled person will select at least one resistor R so that the resistance:

is low enough, and certainly lower than the resistance inside the processor C, measurable at the terminals 4 and 7 when the processor C is disconnected, to achieve the operation just described, i.e. to limit the current flow to the processor C below the value required to achieve the switching on of the processor C; and is high enough to prevent excessive current flow through the switch P electrically closed by water, because the switch P may burn out, or it may overheat and/or cause premature oxidation of the electric wires used for connections and/or overheat or damage the battery B.

In other words, for each circuit made according to these teachings, the field technician will have to perform the described measurements and select accordingly the resistance of the resistor R, or the total resistance of several resistors R in series, so that it matches a value within a range including the minimum and maximum just described. This is an empirical method that allows to effectively and quickly identify the value of the resistance according to the components selected to make the circuit 100. For example, tests carried out by the Applicant have shown that a resistance value between 0.1 kΩ and 100 kΩ is suitable in most cases, i.e. for the circuits 100 intended to control light screens 5 for garments 1, 6. Preferably the resistance is 10 kΩ.

Clearly, when the circuit 100 is not wet or affected by the presence of water or moisture, during normal use by the user, when the switch P is turned to the ON position, this results in current flowing even through the resistor R, or series resistors R, and the current value is proportional to the resistance value. This results in a minimal dissipation of energy in the form of heat.

Preferably, in all embodiments described herein, the resistance inside the processor C, measured at the terminals 4 and 7, is higher than or equal to 150 kΩ.

For example, a processor C suitable for controlling LEDs in a garment, e.g. footwear, has the technical features described in Table 1 below, provided by the manufacturer:

TABLE 1

| features | Symbol | Min | Nominal | Max | Unit | Note |
|---|---|---|---|---|---|---|
| Operating voltage | $V_{DD}$ | 2.0 | 3.0 | 5.5 | V | |
| Operating current | $I_{DD}$ | — | 0.1 | — | mA | No load |
| Stand-by current | $I_{STB}$ | — | — | 2.0 | µA | |
| Absorbed current | $I_{OL}$ | — | 11 | — | mA | @VDS = 1.0 V |
| Operating temperature | Temp. | 0 | 25 | 60 | ° C. | |
| Turning-on frequency of LEDs | | | 2.6 Hz | | | |

Figure 5:
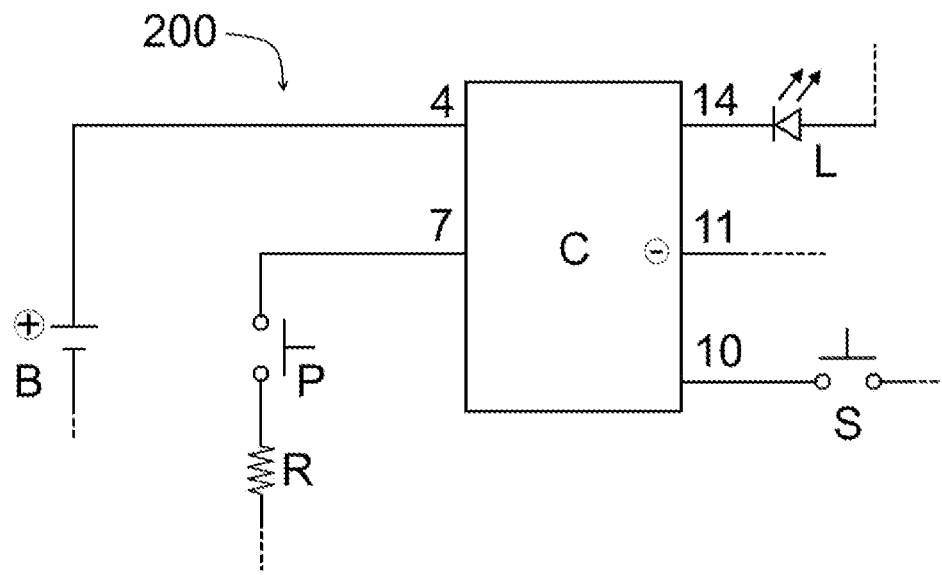
FIG. 5 is a schematic view of a second embodiment of a control circuit for luminous garments, according to the present invention.

FIG. 5 shows a control circuit 200 according to a second embodiment of the present invention. This circuit 200 is different from the circuit 100 described above in that the resistor R (or the series of resistors R) is positioned in series between the switch P and the battery B. In other words, the switch P is positioned along a corresponding power line, between the resistor R and the terminal 7 of the processor C. In this embodiment, the accidental closure of the circuit due to the presence of water is equivalent to adding a resistance—the water resistance—in series with respect to the resistor R. The value of the current reaching the terminal 7 of the processor C is inversely proportional to the sum of the resistances in series and the resistor R is selected with characteristics such that the current value is lower than the value required to cause the processor C to be switched on.

For example, the maximum value of the resistance of the resistor R, or the series resistors used alternatively, has been identified thanks to tests carried out on a circuit 200 intended to control a screen 5 of the footwear 1. This maximum value is 150 kΩ. Above this value, under normal operating conditions of the circuit 200, the energy dissipated by the resistor R would be in excess and the current reaching the processor C would not be sufficient to cause it to be switched on.

More in detail, in case of a circuit 200 intended to control the screen 5 of footwear, the value of the resistance of the resistor R (or the series resistors) added to the value of the resistance of the infiltrated water, which accidentally closes the circuit, must be greater than 150 kΩ; since the resistance of the mains water, used for example in washing machines, is about 80 kΩ, a suitable value of the resistance of the resistor R is for example 100 kΩ. In this example, the sum of the resistances of the resistor R and water is 180 kΩ compared to a resistance only of the resistor R of 100 kΩ only, which is low enough to allow the processor C to be switched on during normal use of the dry circuit 200.

The resistance value of the resistor R and the supply voltage supplied by battery B having equal values, the energy dissipated by the resistor R is lower in the circuit 200 than in the circuit 100.

Figure 6:
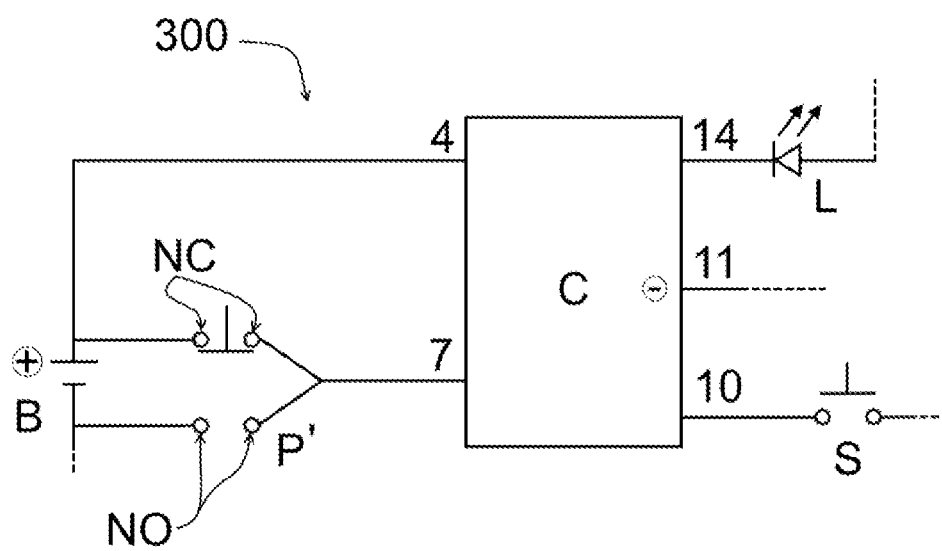
FIG. 6 is a perspective view of a third embodiment of a control circuit for luminous garments, according to the present invention.

FIG. 6 shows a control circuit 300 according to a third embodiment of the present invention. This circuit 300 differs from the circuits 100 and 200 described above in that the switch P is not of ON/OFF type, but is a shunting switch P', preferably a shunting button. The terminals of the normally closed contact (NC) are connected to the positive pole of the battery B and to the terminal 7 of the processor C, respectively. The terminals of the normally open contact (NO) are connected to the negative pole of the battery B and to the terminal 7 of the processor C, respectively.

For simplicity, the shunting switch P' will simply be called switch P'.

In the accidental condition in which water creates an electrical bridge between the contacts NO of the switch P', the electric resistance of the water is higher than the electric resistance of the contact NC of the same switch P'. As a result, the current flow occurs primarily through the contact NC and the current that can flow through the processor C between the terminals 4 and 7 is not high enough to switch the processor C on. The terminal 7 of the processor C remains connected to the positive pole of the battery B and the processor C is not switched on.

Unlike circuits 100 and 200 described above, in the circuit 300 there is no electric power dissipation in a resistor, and this feature can be advantageous.

In the embodiments 400, 500 and 600 that will now be described, the resistor R is functionally interposed between the positive pole of the battery B and the terminal 7 of the processor C, in corresponding configurations.

Figure 7:
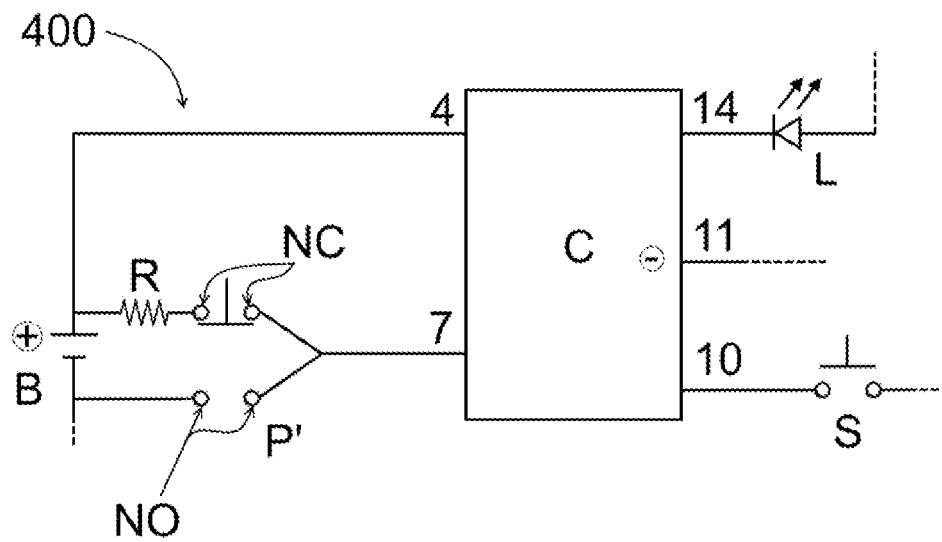
FIG. 7 is a schematic view of a fourth embodiment of a control circuit for luminous garments, according to the present invention.

FIG. 7 shows a control circuit 400 according to a fourth embodiment of the present invention. This circuit 400 comprises the same components as the circuit 300, and therefore comprises a switch P', preferably a shunting button, and in addition a resistor R functionally positioned between the positive pole of the battery B and the contact NC of the switch P'.

Figure 8:
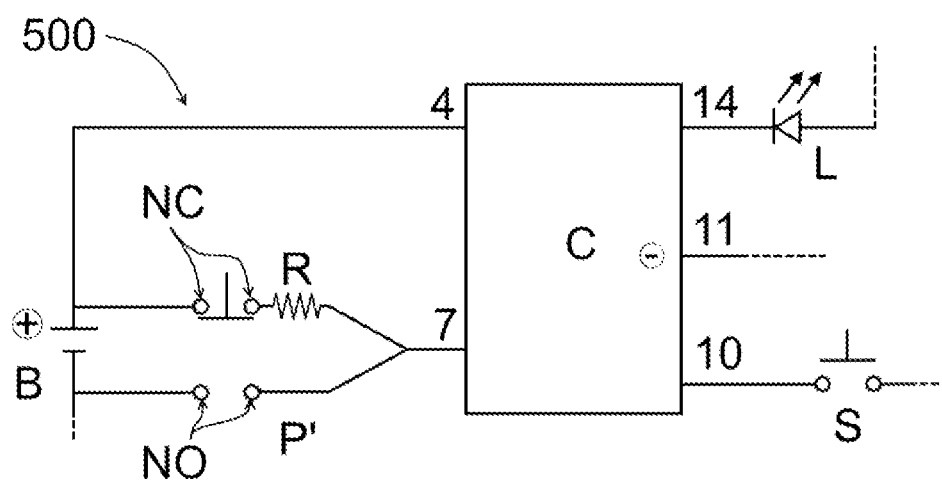
FIG. 8 is a schematic view of a fifth embodiment of a control circuit for luminous garments, according to the present invention.

FIG. 8 shows a control circuit 500 according to a fifth embodiment of the present invention in which, unlike the circuit 400, the resistor R is positioned between the contact NC of the switch P' and the terminal 7, in parallel with the contact NO.

In the circuits 400 and 500 the resistance value of the resistor R is lower than the water resistance. Considering that the water resistance depends on the water hardness, which changes from zone to zone, it is advisable to consider a minimum value among the measured resistance values. If the resistance of the resistor R is higher than the water resistance, when the water closes the contact NO of the switch P' there would be a current flow through the contact NO short-circuited by the water, and therefore the terminal 7 would be connected to the negative pole of the battery B and the processor C would be switched on.

In practice, in the event of a short circuit caused by water, if there is the resistor R the value of the current flowing through the NC contact can be decreased, thereby reducing the risk of electrolysis, and the value of the current flowing through the processor C, supplied at the terminals 4 and 7, remains below the threshold value above which the processor C is switched on.

The resistance value of the resistor R is selected according to this consideration: a very large resistance value would cause a corresponding increase in the current value at the terminal 4, and this could cause the processor C to be undesirably switched on. It is therefore preferable that the resistance of the resistor R is low, so as to increase the current flowing through the same resistor R and simultaneously reduce the value of the current flowing through processor C below the threshold value required for the switching on.

Preferably, the resistance of the resistor R in the circuits 400 and 500 is between 0.1 kΩ and 100 kΩ, and more preferably is of 10 kΩ, as in the example 100 shown in FIG. 4.

On the other hand, in dry conditions, the behavior of the circuit 400, 500 is not affected by the presence of the resistor R, because by normally closing the contact NO the current does not flow through the resistor R but through the processor C, thus switching the latter on.

Figure 9:
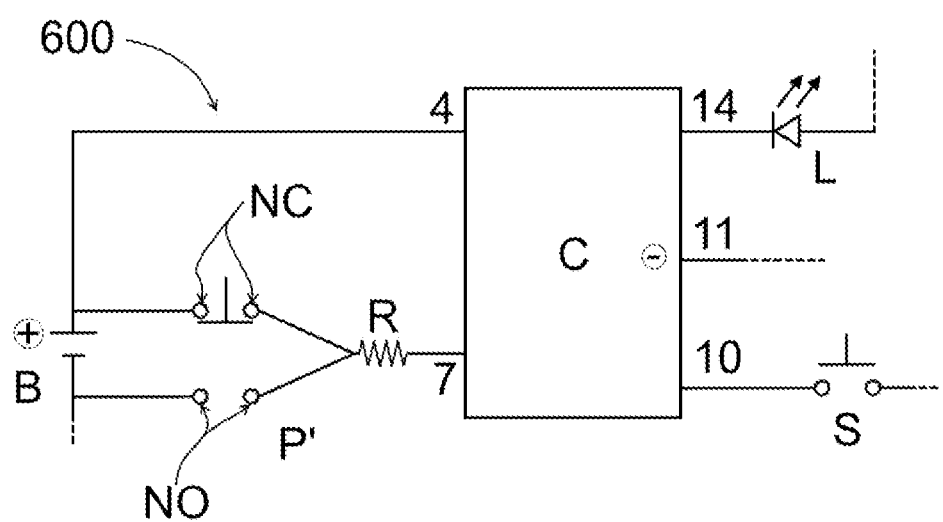
FIG. 9 is a perspective view of a sixth embodiment of a control circuit for luminous garments, according to the present invention.

FIG. 9 shows a control circuit 600 according to a fifth embodiment of the present invention in which, unlike the circuit 400 and the circuit 500, the resistor R is electrically positioned downstream of the contacts NC and NO of the switch P' and before the terminal 7, i.e. in series with respect to the switch P' and the terminal 7.

In the circuit 600, the resistance value of the resistor R may also be higher than the water resistance, without this affecting the operation of the circuit 600 itself.

Compared to the circuits 400 and 500 shown in FIGS. 7 and 8, the contribution given by the circuit 600 to the voltage drop that occurs through the contact NO in the event of a short circuit, is lower and negligible; nevertheless, in the event of short circuit caused by water, the value of current flowing through the processor C decreases, thereby achieving the advantage of being able to prevent the processor C from being undesirably switched on.

If the circuit 600 is dry, during the normal operation, energy is dissipated in the resistor R because there is current flow. Therefore, the dissipation should be preferably limited, in order not to discharge the battery B unnecessarily, and for this reason the resistance of the resistor R is preferably less than 150 kΩ, more preferably is 100 kΩ. This way, in case of normal operation of the dry circuit 600, when the contact NO is closed, the same configuration as the circuit 200 shown in FIG. 5 is obtained.

In the three embodiments 400, 500 and 600 the presence of the resistor R is an advantage over the embodiment 300, because if there is water, the current flowing through the switch P' is lower and the wear by electrolysis is thus limited.

Preferably, in all the described embodiments, power lines are made by using tinned copper cables, which have the advantage of being more resistant to oxidation than traditional untinned copper cables.

As the skilled person will understand, all the embodiments are based on this concept: the resistance inside the processor C measurable at the terminals 4 and 7 must be higher than the resistance of the circuit at the same terminals 4 and 7, so that any closure of the circuit caused by water or condensation will not cause the processor C and, therefore, the light sources L, to be undesirably switched on. Thanks to this solution, in fact, a current flow, and energy dissipation, through the circuit components upstream of the terminals 4 and 7, i.e. the switch P, P' and any resistor R (or resistors) will be achieved and the current absorbed by the processor C will not be enough to cause the latter to be switched on.

The invention claimed is:

1. A control circuit for a luminous garment, comprising:
an electric power source;
a processor; one or more light sources; and
a switch,
wherein the processor and the light sources are powered by the electric power source, and
wherein the light sources are connected to the processor, which controls the turn on and the turn off of the light sources, and
wherein the switch is connected to the electric power source and the processor, and controls the switching on and switching off of the processor,
wherein the positive pole of the electric power source is connected to a first contact of the processor,
wherein the switch is connected to a second contact of the processor, and
wherein the electric resistance of the processor between the first contact and the second contact is higher than the resistance of the circuit between the electric power source and the second contact of the processor.

2. The circuit according to claim 1, wherein the resistance inside the processor, measured between the second contact with the switch and the first contact with the positive pole of the electric power source, is equal to or higher than 150 kΩ.

3. The circuit according to claim 1, wherein the switch is of ON/OFF type and the circuit comprises at least one resistor functionally arranged between the power line that connects the positive pole of the electric power source to the processor and the power line that connects the switch to the processor.

4. The circuit according to claim 3, wherein a total resistance of the at least one resistor, is included in a range of 0.1 kΩ-100 kΩ.

5. The circuit according to claim 1, wherein the switch is of ON/OFF type and the circuit comprises at least one resistor on the power line connecting the switch to the processor, upstream of the switch with respect to the processor.

6. The circuit according to claim 5, wherein a total resistance of the at least one resistor is less than 150 kΩ.

7. The circuit according to claim 1, wherein the switch is a shunting switch with a normally closed contact, which connects the positive pole of the electric power source to the processor, and a normally open contact, which connects the negative pole of the electric power source to the processor, and wherein the normally closed contact and the normally open contact are connected to each other between the shunting switch and the processor.

8. The circuit according to claim 7, wherein at least one resistor is functionally arranged between the positive pole of the electric power source and the normally closed contact of the shunting switch.

9. The circuit according to claim 7, wherein at least one resistor is functionally arranged between the normally closed contact of the shunting switch and the processor.

10. The circuit according to claim 9, wherein the at least one resistor is arranged upstream or downstream with respect to the connection between the normally closed contact and the normally open contact.

11. The circuit according to claim 8, wherein the resistance of the resistor or resistors is less than 150 kΩ.

12. The circuit according to claim 1, wherein wire connections of the circuit are made of tinned copper wires.

13. The circuit according to claim 3, wherein a total resistance of the at least one resistor is equal to 10 kΩ.

14. The circuit according to claim 5, wherein a total resistance of the at least one resistor is equal to 100 kΩ.

15. A method for activating one or more light sources for a luminous garment, comprising:
a) making a control circuit comprising a processor, the one or more light sources and a switch,
b) powering the processor and the one or more light sources by an electric power source,
c) connecting the one or more light sources to the processor, and subordinating the turning on and the turning off of the one or more light sources to the processor,
d) connecting the switch to the electric power source and the processor, so that the switching on and the switching off of the processor are controlled by the switch, wherein
e) configuring the circuit so that the resistance of the processor between a second contact with the switch and a first contact with the positive pole of the electric power source is higher than the resistance of the circuit between the electric power source and the second contact of the processor with the switch.

16. The method according to claim 15, wherein step e) is carried out by:
   e') installing an ON/OFF switch and inserting at least one resistor upstream of the switch with respect to the processor, or downstream of the switch between the line connecting the positive pole of the electric power source to the processor and the line connecting the switch to the processor, or
   e") installing a shunting switch with a normally closed contact, which connects the positive pole of the electric power source to the processor, and a normally open contact, which connects the negative pole of the electric power source to the processor, and wherein the normally closed contact and the normally open contact are connected to each other between the shunting switch and the processor.

17. The method according to claim 16, wherein step e") is carried out by additionally arranging at least one resistor:
   between the positive pole of the electric power source and the normally closed contact of the shunting switch, or
   between the normally closed contact of the shunting switch and the processor, either upstream or downstream of the connection between the normally closed contact and the normally open contact.

* * * * *